United States Patent [19]

Magee et al.

[11] 4,147,564
[45] Apr. 3, 1979

[54] METHOD OF CONTROLLED SURFACE TEXTURIZATION OF CRYSTALLINE SEMICONDUCTOR MATERIAL

[75] Inventors: Thomas J. Magee, Belmont; Richard R. Pettijohn, Portola Valley; Shelley A. Stewart, Santa Clara; Malcolm Thackray, Stanford, all of Calif.

[73] Assignee: SRI International, Menlo Park, Calif.

[21] Appl. No.: 852,786

[22] Filed: Nov. 18, 1977

[51] Int. Cl.² .......................................... H01L 21/306
[52] U.S. Cl. .................................. 148/1.5; 29/569 L; 29/572; 29/576 B; 29/580; 96/35; 136/89 CC; 136/89 SG; 148/187; 156/628; 156/643; 156/647; 156/662; 250/472; 250/492 A; 310/306
[58] Field of Search ................ 156/628, 643, 647, 662, 156/59; 29/572, 576 B, 580, 589, 569 L; 136/89 C, 89 SG, 89 CC; 250/472, 492 A; 148/1.5, 187; 310/306; 357/17; 96/35

[56] References Cited

U.S. PATENT DOCUMENTS

| | | | |
|---|---|---|---|
| 2,989,385 | 6/1961 | Gianola et al. | 156/643 |
| 3,612,871 | 10/1971 | Crawford et al. | 156/643 |
| 3,811,999 | 5/1974 | Fleischer et al. | 156/643 |
| 3,852,134 | 12/1974 | Bean | 250/472 |
| 3,922,206 | 11/1975 | Thackeray | 156/59 |
| 3,936,855 | 2/1976 | Goell et al. | 357/17 |
| 3,949,463 | 4/1976 | Allison et al. | 136/89 CC |

OTHER PUBLICATIONS

Barona et al., "V-Grooved Silicon Solar Cells," *Proc. 11th Photovoltaics Spec. Conf.*, Scotsdale, Ariz., (5/75), pp. 44-48.

Ardt et al., "Optical . . . Cell," *Proc. 11th Photovoltaics Spec. Conf.*, Scotsdale, Ariz., (5/75), pp. 40-43.

*Primary Examiner*—Jerome W. Massie
*Attorney, Agent, or Firm*—Victor R. Beckman

[57] ABSTRACT

A method of forming a microscopically texturized surface on a crystalline semiconductor material is disclosed which method includes the use of a radioactive source for uniformly irradiating the surface. The radioactive source includes a plane surface having a uniform distribution of radioactive material thereon. In one arrangement the radioactive source surface area is at least the size of the polished crystalline semiconductor surface to be texturized, and the radioactive source is positioned closely adjacent the polished surface for a predetermined time period for uniform irradiation of the same. If desired, the radioactive source and crystalline surface may be relatively movable during irradiation of the surface, in which case the source may be in the form of an elongated strip of sufficient length to extend beyond opposite edges of the polished surface area to be texturized. In any case, the large-surface area radioactive source produces a substantially uniform distribution of damage tracks in the crystalline surface, which surface then is anisotropically etched by use of a suitable etching solution. The damage tracks provide etching sites along which etching proceeds at a greater rate than in the undamaged area. Generally the surface to be texturized comprises the (100) orientation surface of a crystalline semiconductor material, such as silicon, at which surface etching preferentially proceeds for exposure of the (111) planes which intersect the surface with fourfold symmetry. With this method a controllable size distribution of tetrahedra may be formed over a large surface.

16 Claims, 9 Drawing Figures

METHOD OF CONTROLLED SURFACE TEXTURIZATION OF CRYSTALLINE SEMICONDUCTOR MATERIAL

BACKGROUND OF THE INVENTION

Surface texturization of material is well known and is employed for a variety of purposes. In the manufacture of integrated circuits removal of portions of a crystalline surface by etching is common as shown, for example, in U.S. Pat. No. 3,765,969. The idea of damaging the surface as by mechanical means or by use of radiation before etching to enhance the etching process also is known as shown in U.S. Pat. Nos. 3,041,226, 3,801,390, and 3,808,068. However, these patents involve isotropic (dissolution) etches, not anisotropic etching for surface texturization. The use of radioactive material for bombarding a plastic sheet to form radiation damage tracks therein which subsequently are etched through the material to form a filter, and not for surface texturization, is shown in U.S. Pat. No. 3,713,921. Additionally, the surface texturization by mechanical damage and etching of the light-incident surface of a silicon substrate included in a solar cell to reduce reflectance is known as disclosed in articles entitled, 'Optical Properties of the COMSAT Non-Reflective Cell' by R. A. Arndt, J. F. Allison, J. G. Haynos and A. Meulenberg, Jr., and 'V-Grooved Silicon Solar Cells' by C. R. Baraona and H. W. Brandhorst, pages 40-43 and 44-48, respectively, of Proc. 11th Photovoltaics Specialists Conf., Scottsdale, Ariz., May 6-8, 1975.

Major disadvantages of photovoltaic, or solar, cells have been the high cost and the low efficiency thereof. Surface texturization of the light-incident silicon surface of solar cells to reduce reflectivity, thereby improving efficiency, has to date involved processes which are costly and/or which do not result in a uniform texturization of the surface as is required for maximum efficiency. In use, thousands of solar cells may be interconnected to provide the necessary power output. With ever-larger diameter crystalline substrates the number of cells required to produce the same output is greatly reduced. However, the increased size of the cells contributes to the difficulty of uniformly texturizing the cell surface. By use of the present texturization process of our invention, large surface areas are uniformly texturized in a controlled manner at a high rate and minimum cost.

SUMMARY OF THE INVENTION AND OBJECTS

An object of this invention is the provision of an improved method of uniformly surface texturizing large area substrates of crystalline semiconductor material at a minimum cost and maximum rate.

The above and other objects and advantages are achieved by uniformly irradiating the surface of the crystalline semiconductor material to be texturized with ionizing radiation to form damage tracks therein, and anisotropically etching the radiation-damaged area for uniformly surface texturizing the same.

A suitable ionizing radiation source for practicing the invention may be provided by use of a plane supporting member, or base, upon which a layer of radioactive material is uniformly disposed. Such source, which is of any required size, provides a substantially uniform number of nuclear emanations per unit time over the entire radioactive surface of the supporting base member. This radioactive source may be placed directly in contact with or closely adjacent the surface of the crystalline semiconductor material to be texturized whereby radioactive particles emanating from the source penetrate the surface of the material to form damage tracks therein. A substantially uniform distribution of damage tracks is provided in the material surface using the above-described large area radioactive source. Obviously, other ionizing radiation means may be employed for the controlled, uniform, irradiation of the surface to be texturized. The damage tracks provide etching sites where etching proceeds at a greater rate than at the remainder of the surface. The radioactive particles may penetrate to approximately the desired etching depth, and the resultant damage tracks are largely removed by the subsequent anisotropic etching step.

The texturization process of this invention is adapted for the surface texturization of crystalline semiconductor material. If desired, or required, the surface to be texturized first may be polished to avoid selective etching at mechanically damaged surface sites. The texturization process of this invention is well adapted for surface texturization of crystalline semiconductor wafers, such as silicon semiconductor wafers, for use in solar cells to reduce incident light reflection therefrom for increased solar cell efficiency. With silicon semiconductor material the (100) orientation surface most commonly is texturized. Employing the above-described texturization process on such surface, a controllable size distribution of generally uniform tetrahedra is formed. After cleaning and rinsing, any remaining damage track portions may be easily removed by annealing at relatively low annealing temperatures.

The texturization process of this invention is well adapted for use in a mass production process by providing for relative movement between the ionizing source and wafer during irradiation. For example, the wafers may be loaded onto a conveyor for movement past the radiation source, or sources. Not only is production facilitated, but the wafer surfaces are more uniformly irradiated for a more uniform distribution of damage tracks and, consequently, a more uniform texturization of the damaged surface, where such relative movement between the ionizing source and wafers is employed.

The invention, as well as other objects and advantages thereof, will become apparent from the following detailed description considered with the accompanying drawings.

BRIEF DESCRIPTION OF THE DRAWINGS

In the drawings, wherein like reference characters refer to the same parts in the several views:

The controlled surface texturization process of this invention is used for the surface texturization of crystalline semiconductor materials. For purposes of illustration only, and not by way of limitation, the invention is shown employed to microscopically texturize the (100) orientation surface of crystalline silicon semiconductor wafers which wafers, in turn, are used in the fabrication of solar cells. In FIG. 1, to which reference now is made, there is shown a photovoltaic, or solar, cell 10 of a type which may be constructed using a crystalline silicon semiconductor having a surface texturized in the manner of the present invention. Briefly, the solar cell is shown comprising a silicon semiconductor wafer 12 of one type (P or N) having a microscopically textured surface 14 at which a substrate junction region 14A is formed. Obviously, the drawing is not to scale. The surface texturization process may be used for the texturization of large crystalline semiconductor surfaces, and the size of the semiconductor wafer 12 used in solar cell construction is not limited by the texturization process. Consequently, large diameter, state-of-the art, semiconductor wafers may be employed.

The opposite polarity junction region 14A is formed, as by diffusion, on the texturized surface 14 of the silicon semiconductor, and a transparent electrode 18 and a base electrode 20 are deposited on the junction layer and semiconductor substrate, respectively, as by evaporation, or the like. If desired, an antireflective layer of, say, tantalum oxide, or the like may be deposited on the transparent electrode. In FIG. 1, the electrodes 18 and 20 are shown connected to a load 22 for the supply of energy thereto produced by the photovoltaic effect at the semiconductor junction. In practice an array which includes a large number of solar cells suitably interconnected to provide the required current and voltage for the load is employed.

Figure 1:
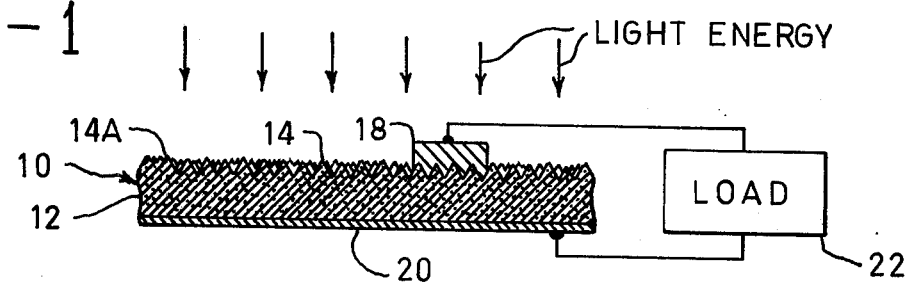
FIG. 1 is a fragmentary sectional view of a solar cell in which the surface of the semiconductor substrate included therein has been texturized in accordance with the texturization process of this invention.
Figure 2:
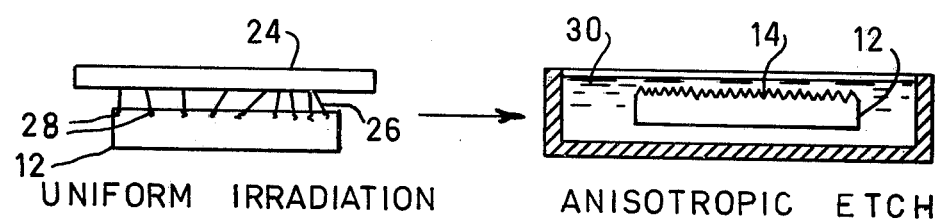
FIG. 2 is a schematic flow diagram showing the texturization process which incorporates the present invention.

Reference now is made to FIG. 2 wherein a flow diagram of the texturization process of the present invention is shown. Broadly, the novel texturization process involves uniform irradiation of the surface of the crystalline semiconductor material to be texturized by an ionizing source to produce a generally uniform distribution of damage tracks in the surface. The irradiated surface then is anisotropically etched for the uniform texturization thereof.

Various means for providing for the required uniform irradiation of the surface to be texturized are contemplated, the invention not being limited to use of any particular source of ionizing radiation.

In the FIG. 2 arrangement, uniform irradiation of the surface of the wafer 12 is effected by use of a large surface ionizing radiation source 24, the radioactive surface of which is at least as large as the surface to be texturized. The source, which is shown positioned adjacent the wafer, has a uniform distribution of radioactive elements thereon for uniform irradiation of the wafer surface. As schematically depicted in FIG. 2, ionizing radiation 26 from the source produces a generally uniform distribution of damage tracks 28 in the (100) orientation surface of the semiconductor wafer 12.

One contemplated means for providing the source 24 with a uniform distribution of radioactive particles involves the use of techniques disclosed in the U.S. Pat. No. 3,922,206 by Malcolm Thackray, one of the present coinventors, issued Nov. 25, 1975, the entire disclosure of which specifically is incorporated by reference herein.

In brief, the radioactive source 24 may be fabricated by use of a photographic film of conventional type comprising a suspension of minute silver halide crystals uniformly dispersed in a colloidal medium. The film is uniformly exposed, and developed in a normal manner for reduction of the silver halide grains to metallic silver, which silver particles, then, are uniformly dispersed in the film. The uniformly and developed film then is treated with a solution containing the desired radioisotope, such as Polonium-210 to provide for a chemical reaction in which the isotope bonds to the silver particles. The amount of isotope deposited, and consequently the number of nuclear emanations per unit time from the source is directly proportional to the density of the silver particles. With a uniform distribution of silver particles in the film, a uniform distribution of the radioactive isotope is provided.

The Polonium-210 radioisotope, uniformly dispersed in the film, provides a uniform source of alpha particles of extended area. It will be apparent that a source of any desired size, for irradiation of any size crystalline wafer, is readily fabricated using the above-described techniques. Before exposure to the radiation source 24, the (100) orientation surface of the silicon semiconductor wafer 12 is cleaned, degreased and dried. The radioactive source 24 then is placed directly on or immediately adjacent the surface to be texturized for exposure to radioactive particles emanating from the source. Because the alpha particles provided by the above-described Polonium-210 source are readily absorbed by air, the source must be located in close proximity to the wafer surface, say within about 3 to 6 mm. thereof, or in direct contact therewith, to minimize or effectively eliminate the air absorption path. Radiation particles from the source 24 are not collimated, and enter the wafer surface over a wide angular range. By using radiation of low penetrating power such as derived from Polonium-210, no elaborate shielding or isotope handling facilities are required, and the wafers are safely irradiated in a conventional manufacturing facility.

With the illustrated alpha particle source, a generally uniform distribution of damage tracks 28 are formed in the polished face of the crystalline silicon semiconductor. After exposure to the radioactive source for a predetermined period of time depending, inter alia, upon the flux of radioactive particles on the source, and the distance between the source and wafer surface, the irradiated surface is anisotropically etched by use of a suitable etchant 30 such as a 60% hydrazine hydrate—40% water solution at, say, 106° C. to form the texturized surface 14. The damage tracks provide etching sites along which etching proceeds at a much greater rate than along undamaged portions of the crystalline surface. As noted above, etching proceeds along the (100) direction, and ceases along (111) directions, thereby exposing (111) facets on the (100) surface. With a silicon semiconductor, the (100) direction is a fourfold symmetry inversion axis whereby tetrahedra of (111) lateral planes are formed by the etching process, with the mirror plane parallel to the semiconductor base.

As is well understood, the anisotropic etching process may be followed by a series of rinses, not shown. As an example, the etched surface may be rinsed in deionized water and benzene, or alcohol, followed by a series of deionized water rinses, after which it is dried for further processing. Although the damage tracks in the semiconductor surface are largely removed by the etching process, there is a possibility that a low density of residual damage sites may remain. In a finished solar cell, such sites would serve as effective carrier recombination and scattering zones and, therefore, should be removed. Any such remaining damage sites may be removed by subjecting the wafer to an annealing process at a relatively low temperature of, say, 900° C. for a period of, say, 15 minutes. After annealing, and subsequent cleaning and rinsing, the wafers are fabricated using conventional techniques.

Figure 3:
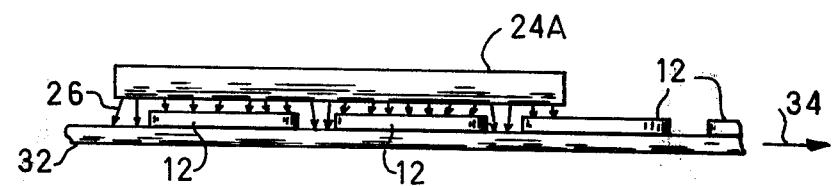
FIG. 3 shows, in generally diagrammatic form, relatively movable means which may be used in the irradiation of wafer surfaces to form the uniformly radiation damage tracks therein.

Other methods of uniformly irradiating the wafer to provide for a uniform distribution of damage tracks in the crystalline semiconductor wafer surface are contemplated. Instead of using a relatively stationary and radioactive source, the source and wafer may be relatively movable as shown, for example, in FIG. 3. There, wafers 12 are disposed on a belt 32 for movement thereof in the direction of arrow 34 directly beneath a radioactive source 24A. The source 24A may be of the same design as the source 24 shown in FIG. 2 and described above. In the arrangement of FIG. 3, the source 24A is of a sufficient size to extend over a plurality of adjacent wafers and is of a sufficient width such that the ends overlap the wafer edges along the wafer diameter. With this arrangement the wafer surfaces are uniformly irradiated as the wafers slowly pass adjacent the radiation source 24A. Obviously, where relative movement of the radiation source and wafers is employed, the source may be of a smaller size, it not being required that it completely cover a single wafer. So long as the entire surface to be texturized can be uniformly irradiated during such relative movement of the source and wafers, any suitable radiation source may be employed. Not only does this method of irradiation involving relative movement of the source and wafers facilitate mass production, but it also enhances the uniformity of distribution of damage tracks produced at the wafer surfaces during irradiation.

Figure 4A:
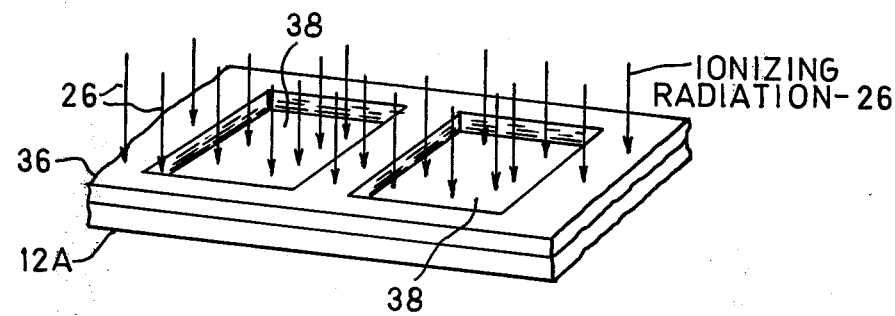
FIG. 4A and 4B show a masked wafer for surface texturization of selected portions of the wafer surface and the resulting wafer surface after texturization, respectively.
Figure 4B:
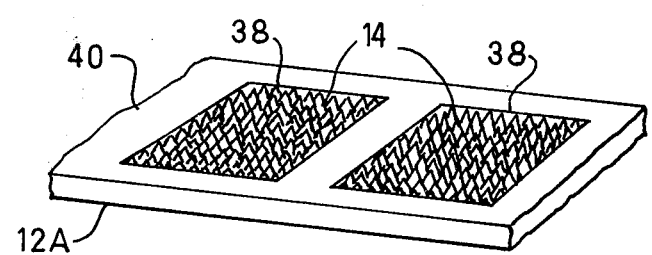

For solar cell use the entire face of the wafer often is texturized whereby no masking of the wafer for selective texturization of the surface is required. For texturization of selected areas, a mask may be formed on the wafer surface to prevent the formation of damage tracks during irradiation, and etching during the subsequent anisotropic etching step. In FIG. 4A, to which reference is made, a wafer 12A formed with a mask 36 is shown for exposure of only selected portions 38 to the ionizing radiation 26 and etchant. Obviously, the mask shape would be selected for the circuit to be fabricated. In FIG. 4B, wherein the wafer 12A is shown after etching and with the mask removed, the areas 38 are shown with texturization 14, surrounded by untexturized surface 40.

Additionally, the invention is not limited to the use of a radiation source on photographic film such as described above. Other large area, uniform, radioactive sources which may be employed include, for example, a source comprising a plane plate, or base member, having one face coated with a plurality of individual radio-active source elements. The elements may comprise, for example, small encapsulated radio-active particles of the type adapted to be ingested for use in medical diagnosis of the digestive tract. The particles are uniformly coated, or attached, to the face of the member by adhesive or other suitable means. Obviously, other large area low energy sources will suggest themselves to those skilled in this art. With the above-described, and other such sources, the source may be of substantially any desired size whereby the novel surface texturization technique may be scaled to accommodate substantially any desired size of crystalline material surface to be texturized.

The radioactive source may comprise a source of spontaneously emitted fission fragments provided, for example, by some radioisotope such as Californium-252, or an alpha active nuclide such as the illustrated Polonium-210 for the production of alpha particles. Also as noted above, where a source such as Polonium-210 is employed no special handling thereof, or of the wafers exposed thereto, is required. However, because the alpha particles from a source such as Polonium-210 are readily absorbed in air, the wafer surface must be located closely adjacent the wafer surface to avoid complete air absorption of the particles. Separation distances on the order of, say, 3 mm or less generally are employed. Obviously, the separation distance may be greatly increased, if desired, by use in a vacuum or with light gases, such as helium, to avoid or minimize absorption between the source and wafer.

Figure 5A:
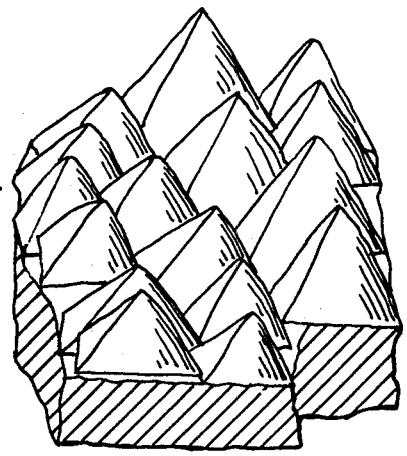
FIGS. 5A and 5B are fragmentary perspective views of texturized crystalline surfaces showing prominent tetrahedra formed thereon after uniform etching times but with different radiation exposure times.
Figure 5B:
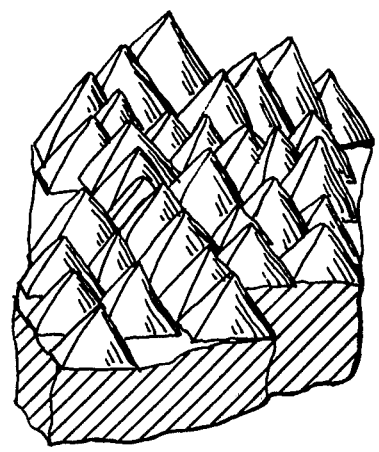

Radiation dose rate, radiation dose, etching solution, and solution etching time are controllable for control of surface density, size and distribution of the tetrahedral sites on the crystalline surface. In one arrangement wherein a dose rate which provided an α-particle track density of $8.7 \times 10^4/mm^2$ per minute of exposure was employed, large well defined tetrahedra were formed, after etching, for radiation exposure times of between about ½ to 2 hours. When exposed for longer than two hours, it was found that a higher density of smaller tetrahedra were formed, after etching, employing comparable etching times. This may be attributed to the rapid nucleation of initial etch sites as a function of radiation dose, resulting in a saturation of smaller tetrahedra sites and a reduction in growth rate. In the generally diagrammatic perspective views of FIGS. 5A and 5B, which show only prominent tetrahedra, texturization of silicon semiconductor surfaces which were exposed to the above-described alpha-particle source for one hour and for sixteen hours, respectively, and which subsequently were etched for 11 minutes are shown. It is readily seen that a greater density of larger tetrahedra are formed for a radiation exposure time of 1 hour than exposure of 16 hours. Control of the size and density of polyhedra formed on crystalline semiconductor material by controlling the radiation dose comprises a feature of the present surface texturization process.

Figure 6:
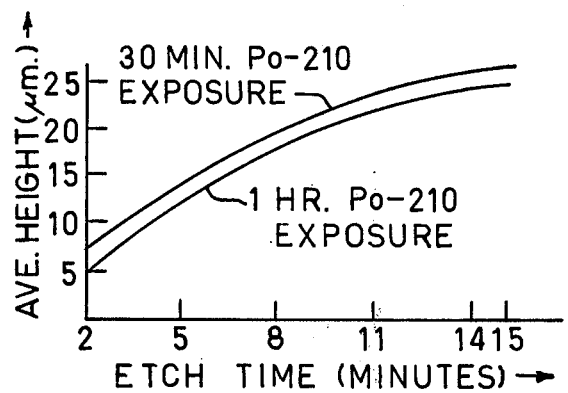
FIG. 6 is a graph showing the average height of prominent tetrahedra as a function of etch time for wafers irradiated for ½ hour and 1 hour.

Reference now is made to FIG. 6 wherein there is shown a plot of the average height of prominent tetrahedra as a function of etch time for silicon semiconductor wafers exposed for ½ hour and 1 hour employing the above-mentioned alpha particle source. It will be seen that for etch times in the range of 2 to 11 minutes the growth rate is approximately linear, approaching a value of 2 $\mu$m./minute. For etch times greater than 11 minutes, the growth rate is reduced, and apparent saturation occurs for etch times exceeding 15 minutes. It here will be noted that for wafers subjected to similar etching schedules but without irradiation, there was a nonuniform development of tetrahedral sites and in relatively low density of surface etch features.

Figure 7:
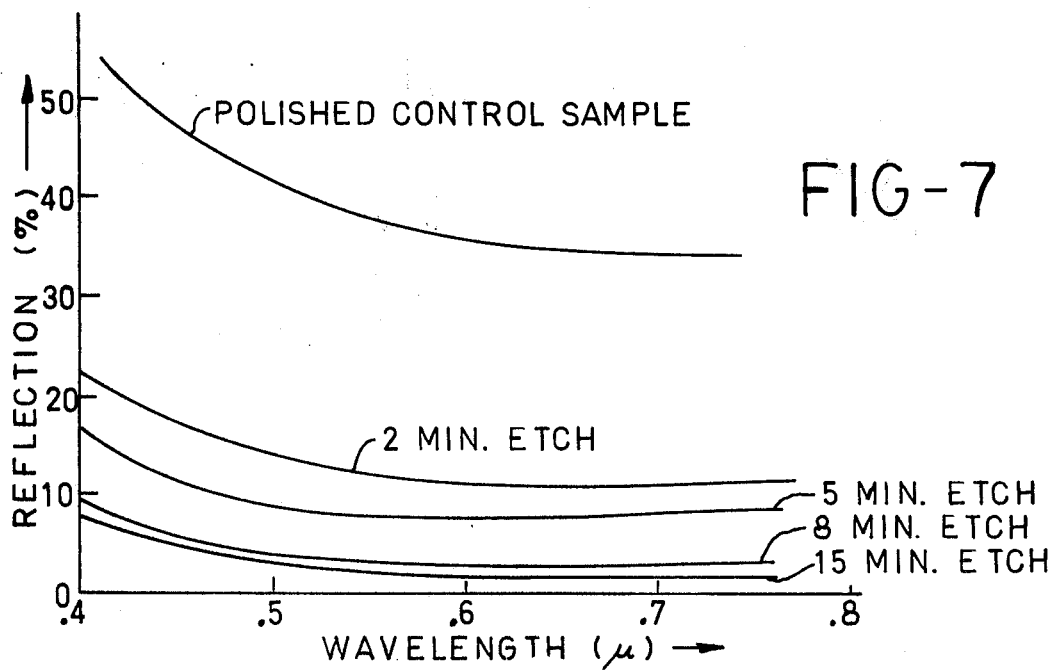
FIG. 7 is a graph which shows reflectivities of the texturized surfaces as a function of radiation exposure time and etch time for wavelengths in the range of 0.4 μm to 0.75 μm.

Reference now is made to FIG. 7 wherein reflectivities of an untexturized polished crystalline silicon surface and of texturized crystalline surfaces as a function of wavelength and etching time for a radiation (alpha-particle) exposure time of ½ hour are shown. It will be seen that texturization of the surface results in a substantial reduction in the reflectivity thereof relative to the polished control sample. The major reduction in this case occurs for etching times of 2–8 minutes duration. Longer etching times produce only small additional changes in reflectivity. Data obtained on a number of silicon samples indicates that the change in reflectivity is directly proportional to the radiation exposure over a wide range for comparable etch durations. Also, it has been found that polished crystalline silicon wafers which are exposed to similar etching times, but no irradiation, do not yield the rapid controllable reduction in reflectivity provided by irradiated wafers.

As noted above, prior art methods of enhancing tetrahedral site production include the use of other surface damaging means such as saw-cut, mechanically abraded, and ultrasonically milled surfaces. However, with such techniques, there is a lack of control, and a lattice damage region on the order of 25 μm often is introduced which would require extensive annealing at temperatures equal to or greater than 1000° C. for defect annihilation. Furthermore, residual damage sites often remain after such annealing, and where the texturization process is used for solar cell fabrication, such residual damage sites result in "dead" zones, or ineffective collection regions on the finished solar cell. With the present surface texturization method, high efficiency solar cells may be produced at a high rate and at a minimum cost.

Obviously, there are numerous other uses for the novel surface texturization process of this invention, the process not being limited to use in the production of solar cells. For example, the process may be employed in the fabrication of field emission sources, and laboratory tests indicate the operability of field emission sources which include as one element an electrode comprising a crystalline semiconductor having a surface texturized in accordance with the present invention. The texturized surface provides a high concentration of microscopic tips, or points, for use as an emitter or field ionizing source.

The invention having been described in detail in accordance with the requirements of the Patent Statutes, various other changes and modifications will suggest themselves to those skilled in this art, and it is intended that such changes and modifications shall fall within the spirit and scope of the invention as defined in the appended claims.

We claim:
1. A method of texturizing the surface of a crystalline semiconductor material, which method comprises,
   irradiating the crystalline semiconductor surface to be texturized uniformly with ionizing radiation from a radiation source to form damage tracks therein, and
   subjecting the area damaged by the ionizing radiation to an etching fluid for anisotropically etching the same for the texturization thereof.

2. The method of surface texturization as defined in claim 1 wherein the texturized surface comprises polyhedra, said method including,
   controlling the size and density of polyhedra formed by controlling the amount of ionizing radiation irradiating the surface to be texturized.

3. The method of surface texturization as defined in claim 1 including terminating said etching immediately after said damage tracks are largely removed by said etching process.

4. The method of surface texturization as defined in claim 1 wherein the texturized surface comprises polyhedra having a maximum height substantially equal to the maximum depth of damage tracks formed by said ionizing radiation.

5. The method of surface texturization as defined in claim 4 including,
   controlling the radiation dose at the surface to be texturized for controlling the size and density of said polyhedra.

6. The method of surface texturization as defined in claim 1 wherein the material surface to be texturized comprises the (100) orientation surface of a crystalline semiconductor wafer, said etching step exposing (111) planes for the production of tetrahedra at the wafer surface.

7. The method of surface texturization as defined in claim 6 wherein said material to be surface texturized comprises silicon.

8. The method of surface texturization as defined in claim 7 which includes,
   fabricating a solar cell from said wafer which cell includes the texturized surface in a junction for incident light to reduce light reflectivity thereat.

9. The method of surface texturization as defined in claim 1 which includes,
   fabricating an electrode for use as a multipoint field emission source which electrode includes the texturized surface as a multi-point source.

10. The method of surface texturization as defined in claim 1 wherein said material comprises a crystalline wafer, and
    said radiation source comprises a radioactive source having a surface area at least as large as the crystalline wafer surface to be texturized.

11. The method of surface texturization as defined in claim 10 which includes,
    placing said radioactive source in substantially direct contact with said wafer while maintaining said wafer and source relatively stationary during the production of damage tracks therein.

12. The method of surface texturization as defined in claim 1 including,
    relatively moving the radiation source and material while irradiating the same for improved uniformity of distribution of the damage tracks over the surface to be texturized.

13. The method of surface texturization as defined in claim 1 which includes establishing said radiation source by,
    developing a uniformly exposed photographic film to provide a uniform distribution of silver particles therein, and
    treating said film with a solution containing a radioisotope for bonding the isotope to the silver particles to provide a uniform distribution of the isotope over the film.

14. The method of surface texturization as defined in claim 13 wherein the solution contains Polonium-210.

15. The method of surface texturization as defined in claim 1 which includes establishing said radiation source by adhering encapsulated radioactive particles to the surface of a plane substrate, said particles being uniformly distributed over the substrate surface.

16. The method of surface texturization as defined in claim 1 wherein said radiation source comprises an alpha-particle source for irradiating said crystalline semiconductor source to be texturized with alpha particles.

* * * * *